(12) United States Patent
Kang

(10) Patent No.: US 10,923,820 B2
(45) Date of Patent: Feb. 16, 2021

(54) ELECTRONIC DEVICE FOR SUPPORTING SHORT-RANGE WIRELESS COMMUNICATION USING FIRST COIL AND SECOND COIL POSITIONED NEXT TO FIRST COIL

(71) Applicant: Samsung Electronics Co., Ltd., Suwon-si (KR)

(72) Inventor: Taejin Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/661,900

(22) Filed: Oct. 23, 2019

(65) Prior Publication Data

US 2020/0127376 A1  Apr. 23, 2020

(30) Foreign Application Priority Data

Oct. 23, 2018 (KR) .......................... 10-2018-0126999

(51) Int. Cl.
| | |
|---|---|
| *H01Q 7/00* | (2006.01) |
| *H01Q 1/24* | (2006.01) |
| *H05K 1/02* | (2006.01) |
| *H04B 5/00* | (2006.01) |
| *H04W 4/80* | (2018.01) |

(52) U.S. Cl.
CPC ............... *H01Q 7/00* (2013.01); *H01Q 1/241* (2013.01); *H04B 5/0081* (2013.01); *H04W 4/80* (2018.02); *H05K 1/0243* (2013.01); *H05K 1/0277* (2013.01); *H05K 2201/10098* (2013.01)

(58) Field of Classification Search
CPC ................................. H01Q 7/00; H01Q 1/241
See application file for complete search history.

(56) References Cited

U.S. PATENT DOCUMENTS

| | | |
|---|---|---|
| 2013/0181876 A1 | 7/2013 | Miura et al. |
| 2014/0009348 A1 | 1/2014 | Behin |
| 2014/0184462 A1 | 7/2014 | Yosui |

(Continued)

FOREIGN PATENT DOCUMENTS

| | | |
|---|---|---|
| EP | 2863480 A1 | 4/2015 |
| KR | 10-2002-0064451 A | 8/2002 |

(Continued)

OTHER PUBLICATIONS

International Search Report dated Feb. 5, 2020 in connection with International Patent Application No. PCT/KR2019/013888, 3 pages.

*Primary Examiner* — Graham P Smith

(57) ABSTRACT

An electronic device includes a housing including a first face, a second face oriented in a direction that is opposite the first face, and a side face between the first face and the second face. The housing also includes a first conductive coil configured to generate a magnetic flux in a first or second direction and a second conductive coil located next to the first conductive coil, and connected to the first conductive coil. The second conductive coil is configured to generate a magnetic flux in a direction opposite a direction of the magnetic flux generated by the first conductive coil. The housing also includes a magnetic guide body configured to guide a magnetic flux radiated in the first or the second direction to a third direction substantially perpendicular to the first or the second direction or to a fourth direction opposite the third direction.

20 Claims, 17 Drawing Sheets

(56) References Cited

U.S. PATENT DOCUMENTS

2015/0137612 A1    5/2015   Yamakawa et al.
2017/0237149 A1    8/2017   Lee et al.

FOREIGN PATENT DOCUMENTS

| KR | 10-1720329 B1 | 3/2017 |
| KR | 10-2017-0094748 A | 8/2017 |
| KR | 10-2018-0054187 A | 5/2018 |
| KR | 10-2018-0064740 A | 6/2018 |

ELECTRONIC DEVICE FOR SUPPORTING SHORT-RANGE WIRELESS COMMUNICATION USING FIRST COIL AND SECOND COIL POSITIONED NEXT TO FIRST COIL

CROSS-REFERENCE TO RELATED APPLICATION

This application is based on and claims priority under 35 U.S.C. § 119 to Korean Patent Application No. 10-2018-0126999, filed on Oct. 23, 2018, in the Korean Intellectual Property Office, the disclosure of which is herein incorporated by reference in its entirety.

BACKGROUND

1. Field

Various embodiments relate to an electronic device including a conductive coil and configured to perform short-range wireless communication using the conductive coil.

2. Description of Related Art

The above information is presented as background information only to assist with an understanding of the disclosure. No determination has been made, and no assertion is made, as to whether any of the above might be applicable as prior art with regard to the disclosure.

In general, along with the increase in the distribution rate of portable electronic devices (e.g., smart phones), the fields of utilization of such portable devices is also expanding to various fields. Magnetic secure transmission (MST) technology is attracting attention as an example of such utilization. When the MST technology is applied to an electronic device, the electronic device is capable of being used not only for basic functions such as call, video/music playback, and route guidance available in existing electronic devices, but also for payment of a prepaid/postpaid traffic charge, credit card payment, an electronic bankbook, and/or identification.

SUMMARY

A conductive coil for MST wireless communication may be accommodated in the inner space of an electronic device. As the inductance of the conductive coil increases, the intensity of magnetic flux increases, which may make it easy to secure radiation performance. However, the fact that the conductive coil has to be accommodated in the limited space of the electronic device and the fact that as the inductance increases, the internal resistance relatively increases, which may make the intensity of magnetic flux weaker, are becoming limitations in increasing the inductance. When a portion of the housing of the electronic device is formed of a conductive material, the intensity of magnetic flux radiated to the outside of the electronic device may be lower than expected due to an eddy phenomenon caused by the conductive material.

Various embodiments provide an electronic device configured to increase the intensity of magnetic flux using the mutual inductance of conductive coils and to radiate the magnetic flux to the outside, bypassing the conductive material.

According to various embodiments, an electronic device may include: a housing including a first face oriented in a first direction, a second face oriented in a second direction that is opposite the first direction, and a side face between the first face and the second face; a conductive material that forms at least a portion of the second face; a first conductive coil located in the housing and below the second face when viewed from above the second face, the first conductive coil configured to generate a magnetic flux in the first direction or the second direction; a second conductive coil located in the housing and next to the first conductive coil when viewed from above the second face, and connected to the first conductive coil in series to form a single current path, the second conductive coil configured to generate a magnetic flux in a direction opposite the direction of the magnetic flux generated by the first conductive coil; a wireless communication circuit located in the housing and configured to feed current to the first conductive coil and the second conductive coil; and a magnetic guide body configured to guide a magnetic flux radiated in the first direction or the second direction to a third direction substantially perpendicular to the first direction or the second direction or to a fourth direction opposite the third direction.

According to various embodiments, an electronic device may include: a housing including a first face oriented in a first direction, a second face oriented in a second direction that is opposite the first direction, and a side face between the first face and the second face; a first conductive coil located in the housing and below the second face when viewed from above the second face, the first conductive coil configured to generate a magnetic flux in the first direction or the second direction; a second conductive coil located in the housing and next to the first conductive coil when viewed from above the second face, and connected to the first conductive coil in series to form a single current path, the second conductive coil configured to generate a magnetic flux in a direction opposite the direction of the magnetic flux generated by the first conductive coil; a wireless communication circuit located in the housing and configured to feed current to the first conductive coil and the second conductive coil; an FPCB including an opening, the first conductive coil being wound about the opening; and a magnetic guide body including a first extension extending in a third direction substantially perpendicular to the first direction or the second direction, a second extension extending in a fourth direction that is opposite the third direction, and a connection portion located in the opening and interconnecting the first extension and the second extension.

According to various embodiments of the disclosure, it is possible to secure desired radiation performance without increasing the internal resistance even though conductive coils are accommodated in the limited inner space since the intensity of magnetic fluxes is increased by the mutual inductance generated due to the interaction between the conductive coils in addition to the self-inductances of the conductive coils. In addition, it is possible to secure desired radiation performance since the magnetic fluxes generated in the inner space are radiated to the outside of the electronic device, bypassing a conductive material.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the disclosure and its advantages, reference is now made to the following description taken in conjunction with the accompanying drawings, in which like reference numerals represent like parts, and in which.

DETAILED DESCRIPTION

FIGS. 1 through 11F, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
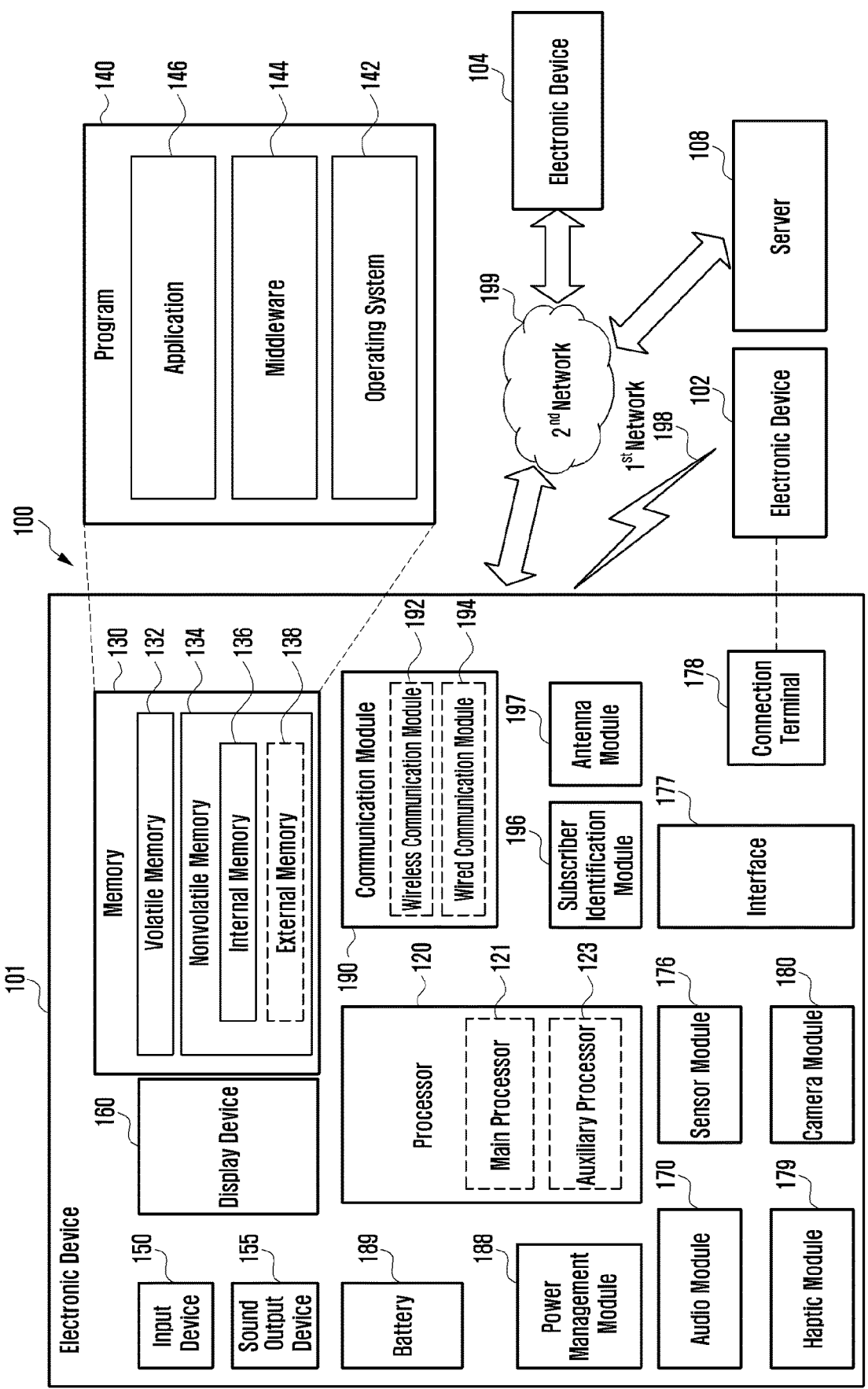
FIG. 1 illustrates a view of an electronic device within a network environment in various embodiments.

FIG. 1 illustrates a block diagram of an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
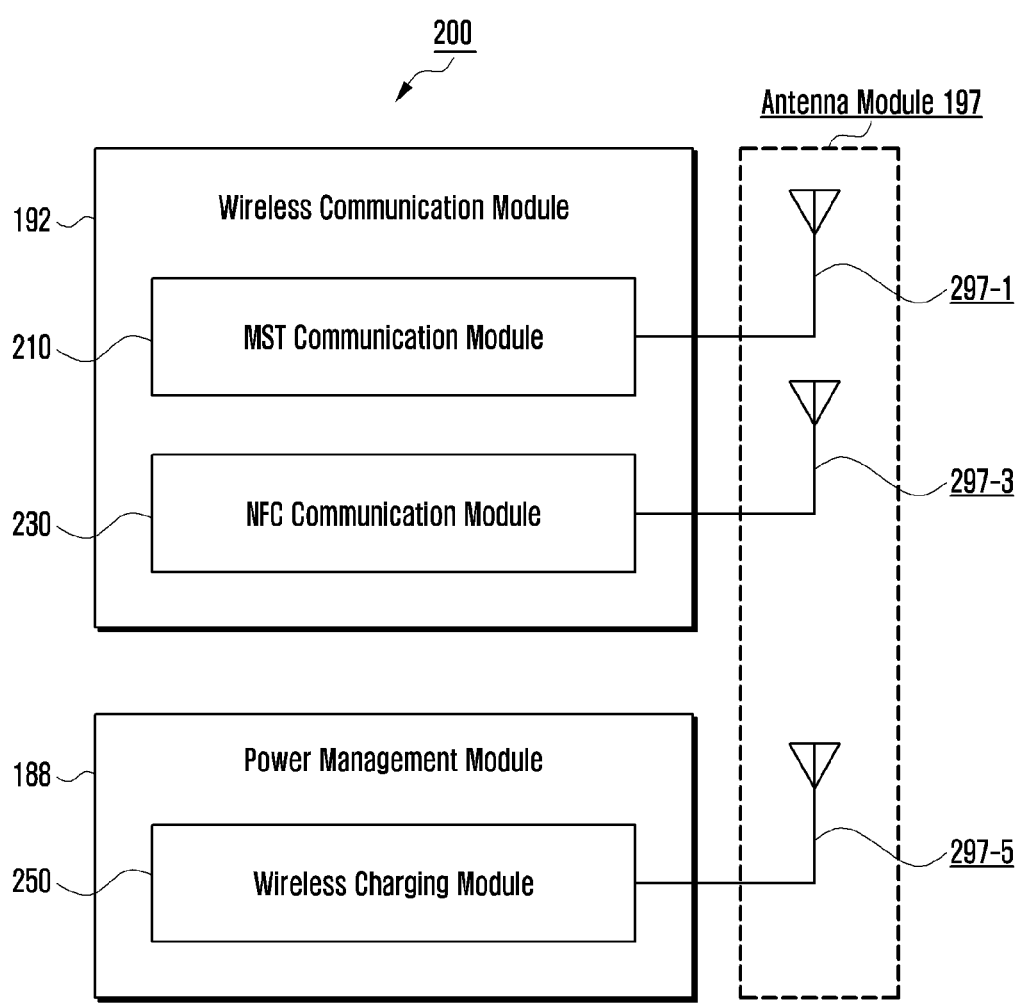
FIG. 2 illustrates a block diagram of a wireless communication module, a power management module, and an antenna module of an electronic device according to various embodiments.

FIG. 2 illustrates a block diagram 200 of the wireless communication module 192, the power management module 188, and the antenna module 197 of the electronic device 101 according to various embodiments. Referring to FIG. 2, the wireless communication module 192 may include a magnetic secure transmission (MST) communication module 210 or a near-field communication (NFC) module 230, and the power management module 188 may include a wireless charging module 250. In such a case, the antenna module 197 may include a plurality of antennas that include a MST antenna 297-1 connected with the MST communication module 210, a NFC antenna 297-3 connected with the NFC communication module 230, and a wireless charging antenna 297-5 connected with the wireless charging module 250. For ease of description, the same components as those described in regard to FIG. 1 are briefly described or omitted from the description.

The MST communication module 210 may receive a signal containing control information or payment information such as card information from the processor 120, generate a magnetic signal corresponding to the received signal, and then transfer the generated magnetic signal to the external electronic device 102 (e.g., a point-of-sale (POS) device) via the MST antenna 297-1. To generate the magnetic signal, according to an embodiment, the MST communication module 210 may include a switching module (not shown) that includes one or more switches connected with the MST antenna 297-1, and control the switching module to change the direction of voltage or current supplied to the MST antenna 297-1 according to the received signal. The change of the direction of the voltage or current allows the direction of the magnetic signal (e.g., a magnetic field) emitted from the MST antenna 297-1 to change accordingly. If detected at the external electronic device 102, the magnetic signal with its direction changing may cause an effect (e.g., a waveform) similar to that of a magnetic field that is generated when a magnetic card corresponding to the card information associated with the received signal is swiped through a card reader of the electronic device 102. According to an embodiment, for example, payment-related information and a control signal that are received by the electronic device 102 in the form of the magnetic signal may be further transmitted to an external server 108 (e.g., a payment server) via the network 199.

The NFC communication module 230 may obtain a signal containing control information or payment information such as card information from the processor 120 and transmit the obtained signal to the external electronic device 102 via the NFC antenna 297-3. According to an embodiment, the NFC communication module 230 may receive such a signal transmitted from the external electronic device 102 via the NFC antenna 297-3.

The wireless charging module 250 may wirelessly transmit power to the external electronic device 102 (e.g., a cellular phone or wearable device) via the wireless charging antenna 297-5, or wirelessly receive power from the external electronic device 102 (e.g., a wireless charging device). The wireless charging module 250 may support one or more of various wireless charging schemes including, for example, a magnetic resonance scheme or a magnetic induction scheme.

According to an embodiment, some of the MST antenna 297-1, the NFC antenna 297-3, or the wireless charging antenna 297-5 may share at least part of their radiators. For example, the radiator of the MST antenna 297-1 may be used as the radiator of the NFC antenna 297-3 or the wireless charging antenna 297-5, or vice versa. In such a case, the antenna module 197 may include a switching circuit (not shown) adapted to selectively connect (e.g., close) or disconnect (e.g. open) at least part of the antennas 297-1, 297-3, or 297-5, for example, under the control of the wireless communication module 192 (e.g., the MST communication module 210 or the NFC communication module 230) or the power management module (e.g., the wireless charging module 250). For example, when the electronic device 101 uses a wireless charging function, the NFC communication module 230 or the wireless charging module 250 may control the switching circuit to temporarily disconnect at least one portion of the radiators shared by the NFC antenna 297-3 and the wireless charging antenna 297-5 from the NFC antenna 297-3 and to connect the at least one portion of the radiators with the wireless charging antenna 297-5.

According to an embodiment, at least one function of the MST communication module 210, the NFC communication module 230, or the wireless charging module 250 may be controlled by an external processor (e.g., the processor 120). According to an embodiment, at least one specified function (e.g., a payment function) of the MST communication module 210 or the NFC communication module 230 may be performed in a trusted execution environment (TEE). According to an embodiment, the TEE may form an execution environment in which, for example, at least some designated area of the memory 130 is allocated to be used for performing a function (e.g., a financial transaction or personal information-related function) that requires a relatively high level of security. In such a case, access to the at least some designated area of the memory 130 may be restrictively permitted, for example, according to an entity accessing thereto or an application being executed in the TEE.

Figure 3:
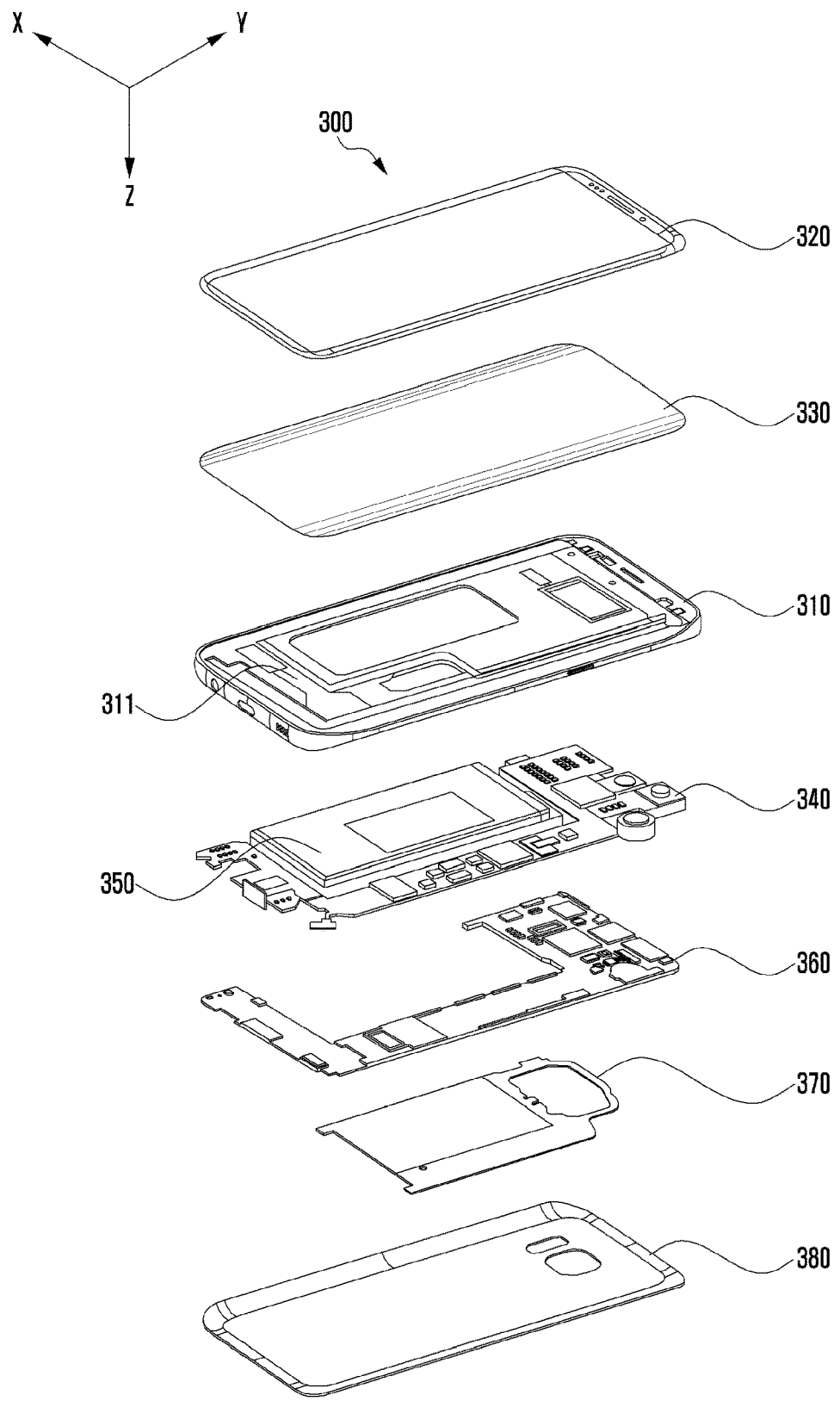
FIG. 3 illustrates an exploded perspective view of a mobile electronic device according to an embodiment.

FIG. 3 illustrates an exploded perspective view of a mobile electronic device according to an embodiment.

Referring to FIG. 3, an electronic device 300 (e.g., the electronic device 101 in FIG. 1) may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. The front plate 320 may form a first face (or the front face) of the electronic device 300, the rear plate 380 may form a second face (or the rear face) of the electronic device 300, and the side bezel structure 310 may form side faces surrounding the space between the first face and the second face. According to an embodiment, a structure including the first face, the second face, and the side faces may be referred to as a housing. In some embodiments, at least one of the components (e.g., the first support member 311 or the second support member 360) may be omitted from the electronic device 300, or the electronic device 300 may additionally include other components.

The first support member 311 may be disposed inside the electronic device 300 and may be connected to the side bezel structure 310 or may be formed integrally with the side bezel structure 310. The first support member 311 may be formed of, for example, a metal material and/or a non-metal (e.g., polymer) material. The display 330 may be coupled to a first face of the first support member 311, and the printed circuit board 340 may be coupled to a second face of the first support member 332 (not shown). On the printed circuit board 340, a processor, a memory, and/or an interface may be mounted. The processor may include at least one of, for example, a central processing unit, an application processor, a graphic processor, an image signal processor, a sensor hub processor, or a communication processor.

The memory may include, for example, volatile memory or nonvolatile memory.

The interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

The battery 350 is a device for supplying power to at least one component of the electronic device 300, and may include, for example, a non-rechargeable primary battery, a rechargeable secondary battery, or a fuel cell. At least a portion of the battery 350 may be disposed to be substantially flush with, for example, the printed circuit board 340. The battery 350 may be integrally disposed within the electronic device 300, or may be detachably mounted on the electronic device 300.

The antenna 370 (e.g., the antenna module 197 in FIG. 1) may be disposed between the rear plate 380 and the display 350. The antenna 370 may include, for example, a near-field communication (NFC) antenna, a wireless charging antenna, and/or a magnetic secure transmission (MST) antenna (e.g., the MST antenna 279-1 in FIG. 2). The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 4A:
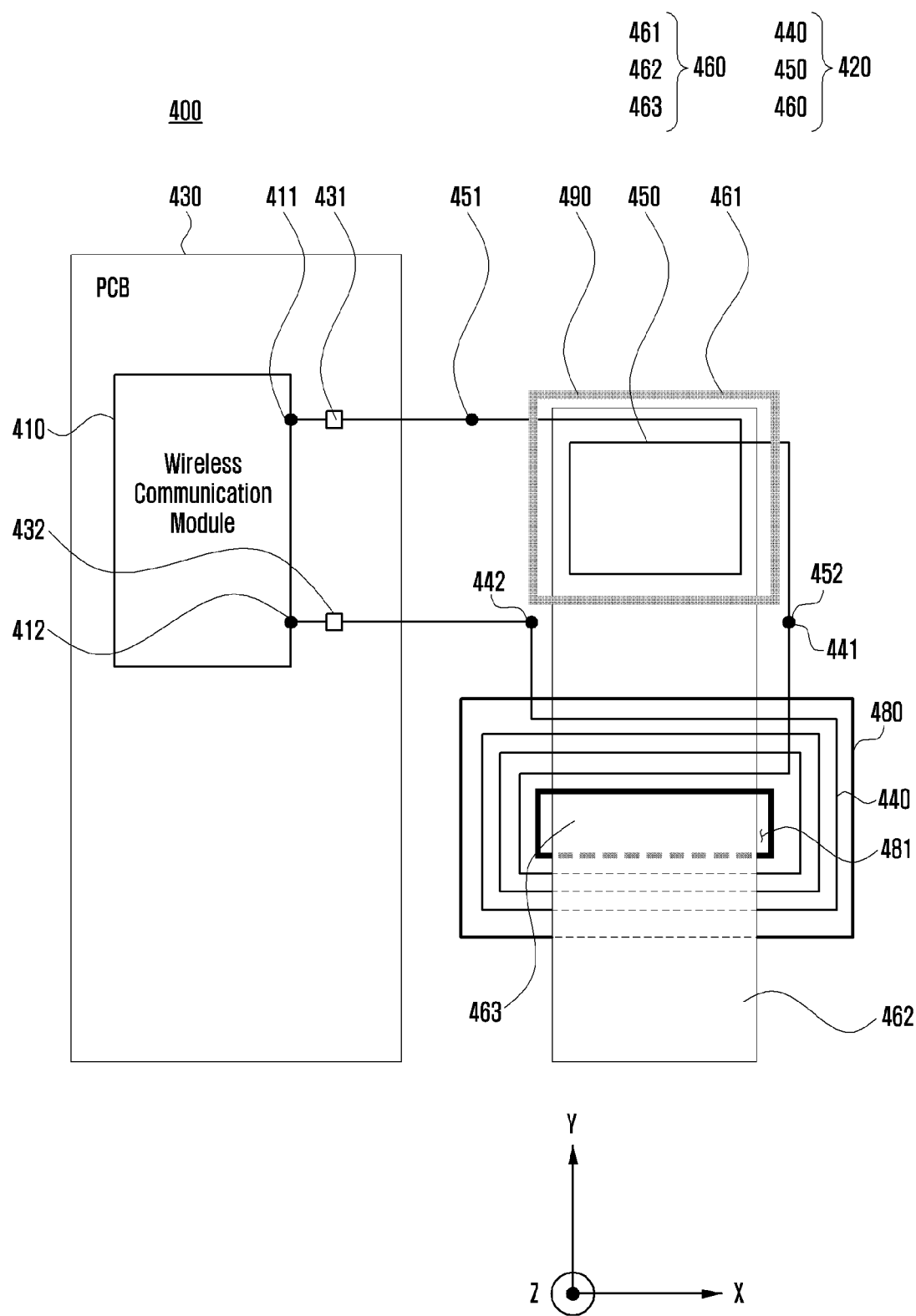
FIG. 4A illustrates a view of an electronic device according to various embodiments that includes an antenna for wireless communication.
Figure 4B:
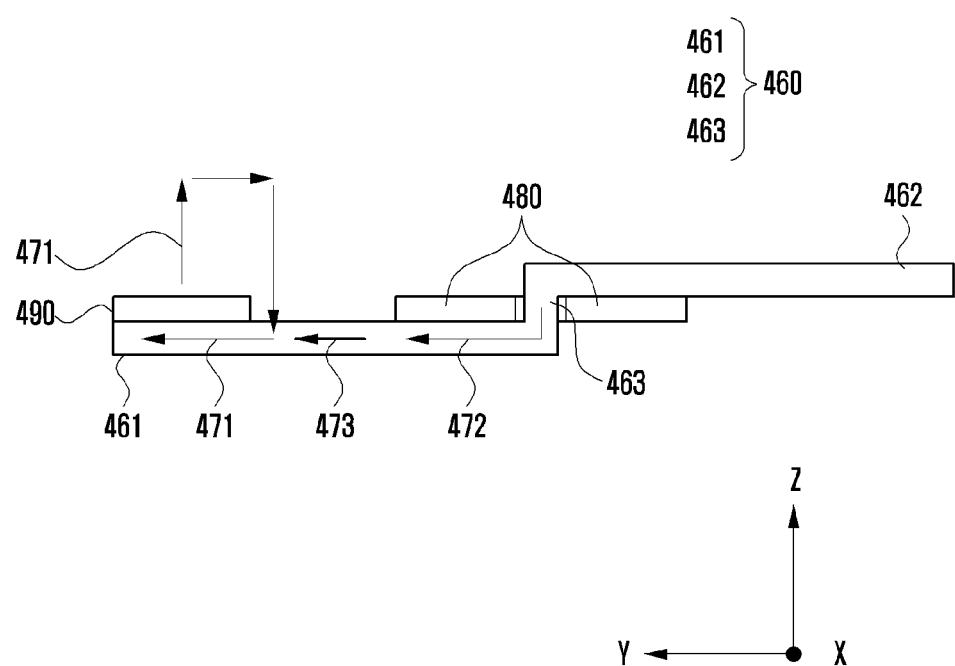
FIG. 4B illustrates a schematic view of a side face of the antenna of FIG. 4A.

FIG. 4A illustrates a view of an electronic device 400 according to various embodiments that includes an antenna for wireless communication. FIG. 4B illustrates a schematic view of a side face of the antenna of FIG. 4A. Referring to FIGS. 4A and 4B, the electronic device 400 (e.g., the electronic device 101 in FIG. 1) may include a wireless communication module 410 (e.g., the MST communication module 230 in FIG. 2) and an antenna 420 (e.g., the MST antenna 297-1 in FIG. 2).

According to various embodiments, the wireless communication module 410 may be mounted on a PCB 430 (e.g., the printed circuit board 340 of FIG. 3).

According to various embodiments, multiple pads for electrically connecting the wireless communication module 410 to the antenna 420 may be formed on the PCB 430. For example, a first electrode 411 and a second electrode 412 of the wireless communication module 410 may be electrically connected to the antenna 420 through a first pad 431 and a second pad 432, respectively.

According to various embodiments, the antenna 420 may be disposed between a rear plate (not illustrated) (e.g., the rear plate 380 in FIG. 3) and a battery (not illustrated) (e.g., the battery 350 of FIG. 3). The rear plate may be formed of, for example, coated or colored glass, ceramics, polymer, metal (e.g. aluminum, stainless steel (STS), or magnesium), or a combination of at least two of these materials.

According to various embodiments, the antenna 420 may include a first conductive coil 440, a second conductive coil 450, and a magnetic guide body 460. The first conductive coil 440 and the second conductive coil 450 may be configured to generate magnetic fluxes (in other words, magnetic signals) in opposite directions. For example, one of the first conductive coil 440 and the second conductive coil 450 may be disposed to generate fluxes in a first direction (e.g., in the positive direction of the Z axis) and the other of the first conductive coil 440 and the second conductive coil 450 may be configured to generate magnetic fluxes in a second direction opposite the first direction (e.g., in the negative direction of the Z axis). The magnetic guide body 460 may be configured to guide the fluxes, generated from the first conductive coil 440 and the second conductive coil 450, in a third direction (e.g., in the Y-axis direction) substantially perpendicular to the first direction or the second direction and in a fourth direction (the direction opposite the second direction). The magnetic fluxes guided in the third and fourth directions may be emitted to the outside of the electronic device 400 through the non-conductive portions of the electronic device (e.g., the non-conductive portion of the side bezel structure 310, the non-conductive portion of the rear plate 380 adjacent to the side bezel structure 310, and/or the non-conductive portion of the front plate 320 adjacent to the side bezel structure 310 in FIG. 3).

According to an embodiment, the first conductive coil 440 and the second conductive coil 450 may be configured as a series circuit having one current path. For example, a first electrode 451 of the second conductive coil 450 may be electrically connected to the first pad 431, and a second electrode 452 of the second conductive coil 450 may be electrically connected to a first electrode 441 of the first conductive coil 440. A second electrode 442 of the first conductive coil 440 may be electrically connected to the second pad 432. The first conductive coil 440 may be a flat (or a spiral) coil spirally wound about the Z axis (e.g., the Z axis in FIG. 3) in one direction (e.g., counterclockwise, as illustrated in the drawing) on the XY plane (e.g., the XY plane in FIG. 3). The second conductive coil 450 may be a flat coil wound in a direction opposite the direction in which the first conductive coil 440 is wound (e.g., clockwise). Accordingly, when current is fed to the first electrode 451 of the second conductive coil 450, current is capable of flowing in the clockwise direction in the second conductive coil 450, and a first flux 471 in the first direction (e.g., in the positive direction of the Z axis) is capable of being generated due to the above-mentioned current direction and the self-inductance of the second conductive coil 450. The current is capable of being applied to the first electrode 441 of the first conductive coil 440 through the second electrode 452 of the second conductive coil 450, and a current path in a counterclockwise direction is capable of being formed in the first conductive coil 440A. A second magnetic flux 472 in the second direction (e.g., the negative direction of the Z axis) is capable of being generated due to the current direction in the first conductive coil 440 and the self-inductance of the first conductive coil 440. In addition, a third magnetic flux 473 may be generated by mutual inductance between the first conductive coil 440 and the second conductive coil 450.

According to an embodiment, the magnetic guide body 460 may guide the first magnetic flux 471 in the first direction or in the third direction (e.g., the Y-axis direction) substantially perpendicular to the second direction, and may guide the second magnetic flux 472 in the same direction as the direction in which the first magnetic flux 471 is guided. In summary, when the conductive coils 440 and 450 are coupled (so-called aiding connection) so that the directions of the magnetic fluxes guided in the magnetic guide body 460 are equal to each other, the total inductance guided by the conductive coils 440 and 450 may be L1+L2+2M. Here, L1 is the self-inductance of the first conductive coil 440, L2 is the self-inductance of the second conductive coil 450, and M is the mutual inductance generated by interaction between the first conductive coil 440 and the second conductive coil 450. By this mutual inductance, a third magnetic flux 473 may be generated in the same direction as the first magnetic flux 471 and the second magnetic flux 472. A magnetic flux may be generated in the antenna 420 due to the total inductance. The magnetic flux may spread in the third direction and/or the fourth direction via the magnetic guide body 460, and may be radiated to the outside of the electronic device 400 through the non-conductive portion of the electronic device 400. Meanwhile, when the coils are coupled such that the directions of the magnetic fluxes guided in the magnetic guide body 460 are opposite each other (a so-called "opposing connection"), the total inductance guided by the conductive coils 440 and 450 may be L1+L2−2M.

According to various embodiments, the first conductive coil 440 may be formed on a first flexible printed circuit board (FPCB) 480, which includes one or more layers. For example, the first FPCB 480 may include one layer, and the first conductive coil 440 may be formed on the first FPCB 480 by being wound in a direction (e.g., counterclockwise) opposite the direction in which the second conductive coil 450 is wound (e.g., clockwise). As another example, the first FPCB 480 may include multiple layers, and the first conductive coil 440 may include a $(1-1)_{th}$ conductive coil wound in one direction (e.g., counterclockwise) and disposed on the first layer of the first FPCB 480, and a $(1-2)_{th}$ conductive coil wound in the same direction as the $(1-1)_{th}$ conductive coil and disposed on the second layer of the FPCB 480. The first FPCB 480 may include a via connecting one end of the $(1-1)_{th}$ conductive coil and one end of the $(1-2)_{th}$ conductive coil.

According to various embodiments, an opening 481 may be formed in the first FPCB 480 in the first direction (e.g., the Z-axis direction), and the first conductive coil 440 may be wound around the opening 481. The magnetic guide body 460 may include a first extension 461 located below the first FPCB 480 and extending in the third direction (e.g., the Y-axis direction), a second extension 462 located above the first FPCB 480 and extending in the fourth direction, and a connection portion 463 located in the opening 481 and interconnecting the first extension 461 and the second extension 462. The second conductive coil 450 may be located above the first extension 461 in the state of being insulated from the magnetic guide body 460. For example, the second conductive coil 450 may be disposed on a second FPCB 490 including at least one layer, and the second FPCB 490 may be located above the first extension 461. The first extension 461 may guide the magnetic fluxes (e.g., the first magnetic flux 471, the second magnetic flux 472, and the third magnetic flux 473), generated when current is fed to the first electrode 451 of the second conductive coil 450, in the third direction. The second extension 462 may guide the magnetic fluxes (e.g., magnetic fluxes generated in the directions opposite those of the first magnetic flux, the second magnetic flux, and the third magnetic flux, respectively), generated when current is fed to the second electrode 442 of the first conductive coil 440, in the fourth direction. The first extension 461 and the second extension 462 are capable of shielding (or protecting) the electronic components (e.g., the display 330 in FIG. 3, the battery 350 in FIG. 3, and components (e.g., a processor) disposed on the PCB 340 in FIG. 3) disposed below the antenna 420 from the influence of magnetic fluxes by guiding the magnetic fluxes toward the side faces of the electronic device 400.

According to various embodiments, the magnetic guide body 460 may be made of a ferromagnetic substance with a high magnetic permeability, such as mu-metal (e.g., permalloy, silicon metal, or Fe+Ni) or ferrite. The magnetic guide body 460 may be made of a soft ferrite. The magnetic guide body 460 may be made of a combination of a ferromagnetic substance and a soft magnetic substance.

Figure 5:
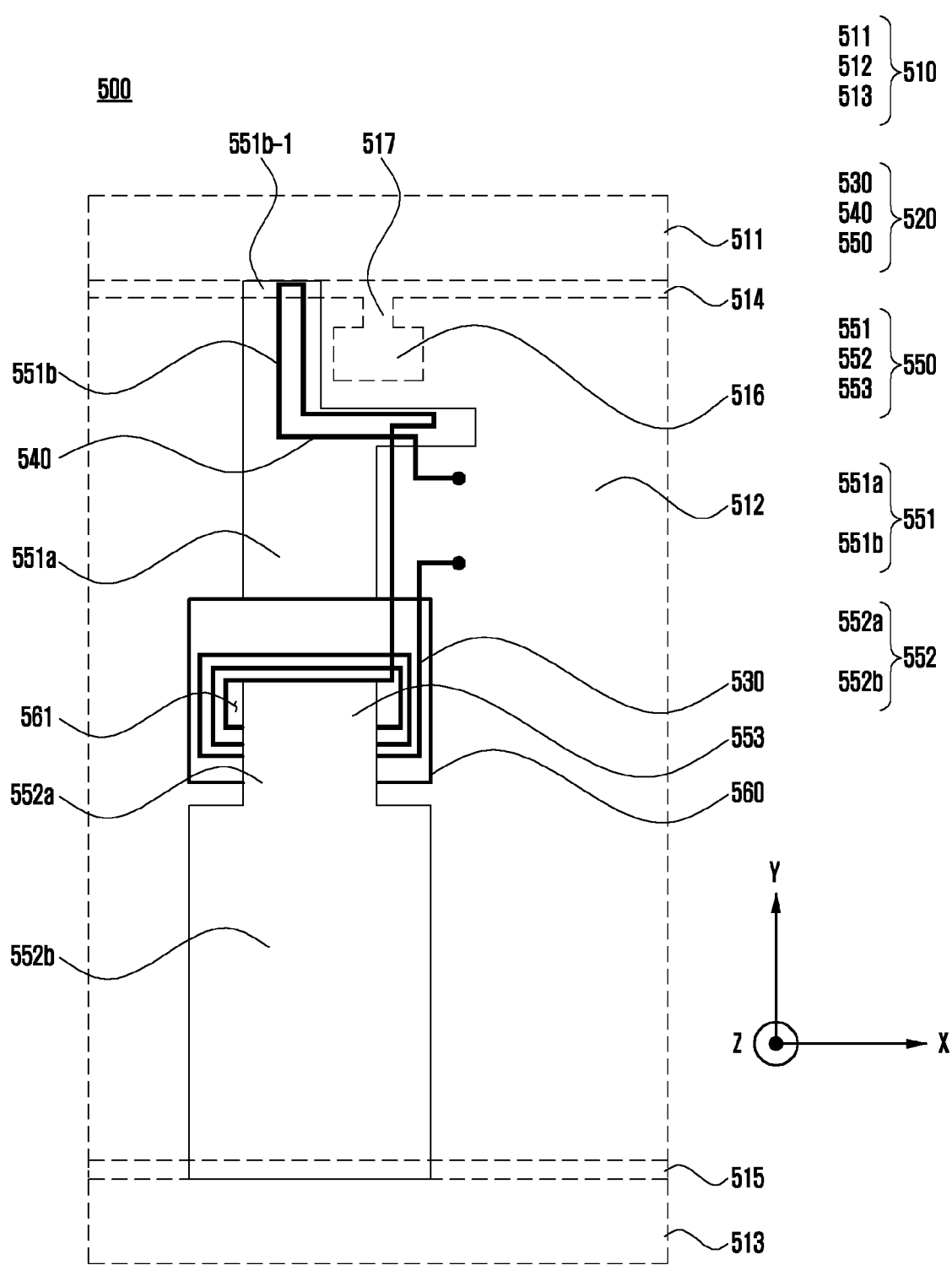
FIG. 5 illustrates a view of the rear face of an electronic device according to various embodiments and an antenna positioned thereunder.

FIG. 5 illustrates a view of the rear face of an electronic device 500 according to various embodiments and an antenna positioned thereunder. Referring to FIG. 5, the rear face 510 of the electronic device 500 may be formed of a conductive material (e.g., metal), and an anodizing technique may be applied in order to impart a color thereto. The rear face 520 may be divided into an upper area 511, a central area 512 and a lower area 513. For example, the upper area 511 and the central area 512 may be separated by an upper slit 514 formed in a linear shape in the X-axis direction. In addition, the central area 512 and the lower area 513 may be separated by a lower slit 515 formed in a linear shape in the X-axis direction. The upper slit 514 may be filled with a first non-conductive material, and the lower slit 515 may be filled with a second non-conductive material. In the central area 512, an opening 516 may be formed in a portion adjacent to the upper slit 514 to visually expose the lens of the camera to the outside. Another slit 517 connecting the opening 516 and the upper slit 514 may be formed between the opening 516 and the upper slit 514 in the Y axis direction, and this slit 571 may also be filled with a non-conductive material. An antenna 520 (e.g., the antenna 420 in FIG. 4A) may be disposed below the rear face 510 when viewed from above the rear face 510. The antenna 520 may include a first conductive coil 530, a second conductive coil 540, and a magnetic guide body 550. One of the first conductive coil 530 (e.g., the first conductive coil 440 in FIG. 4A) and the second conductive coil 540 (e.g., the second conductive coil 450 in FIG. 4A) may be configured to generate a magnetic flux in the first direction (e.g., the positive direction of the Z-axis) and the other one may be configured to generate a magnetic flux in the second direction (the direction opposite the first direction). The magnetic guide body 550 may be configured to guide the fluxes, generated from the first conductive coil 530 and the second conductive coil 540, in a third direction (e.g., in the Y-axis direction) substantially perpendicular to the first direction or the second direction or in a fourth direction (the direction opposite the third direction). The first conductive coil 530 may be disposed on the FPCB 560, and the second conductive coil 540 may be disposed on the magnetic guide body 550 in the state of being insulated from the magnetic guide body 550.

According to various embodiments, when viewed from above the rear face 510, the magnetic guide body 550 may include a first extension 551 located below the first FPCB 560 and extending to the upper slit 514, a second extension 552 located above the first FPCB 560 and extending to the lower slit 515, and a connection portion 553 located in the opening 561 in the FPCB 560 and interconnecting the first extension 551 and the second extension 552. According to an embodiment, the first extension 551 may include a $(1-1)_{th}$ extension 551a extending from the connection portion 553, and a $(1-2)_{th}$ extension 551b extending from the $(1-1)_{th}$ extension 551a to the upper slit 514 so as not to overlap the opening 516 when viewed from above the rear face 510. The second extension 552 may include a $(2-1)_{th}$ extension 552a extending from the connection portion 553, and a $(2-2)_{th}$ extension 552b that is thicker than the $(2-1)_{th}$ extension 552a when viewed from above the rear face 510 and extends from the $(2-1)_{th}$ extension 552a to the lower slit 515.

According to various embodiments, the second conductive coil 540 may be located above the first extension 551 in the state of being insulated from the magnetic guide body 550 (e.g., disposed on an FPCB). According to an embodiment, the second conductive coil 540 may be a coil that is wound once or more along a path passing through an end portion 551b_1 of the $(1-2)_{th}$ extension 551 and is then connected to the first conductive coil 530.

According to various embodiments, the total inductance of the antenna 520 due to the mutual induction between the first conductive coil 530 and the second conductive coil 540 may be, for example, "L1+L2+2M" as described above with reference to FIG. 4, through aiding connection. A magnetic flux corresponding to the total inductance may be generated in the antenna 520, and the magnetic flux may be guided to the upper slit 514 or the lower slit 515 by the magnetic guide body 550 so as to be radiated to the outside through the upper slit 514 or the lower slit 515 (e.g., through the non-conductive material with which the slits are filled).

According to some embodiments, the first conductive coil 530 and the second conductive coil 540 may be configured in a series circuit together with a separate conductor (e.g., a portion adjacent to the upper slit 514 in the central area 512), so that the intensity of the magnetic flux can be further increased.

Figure 6:
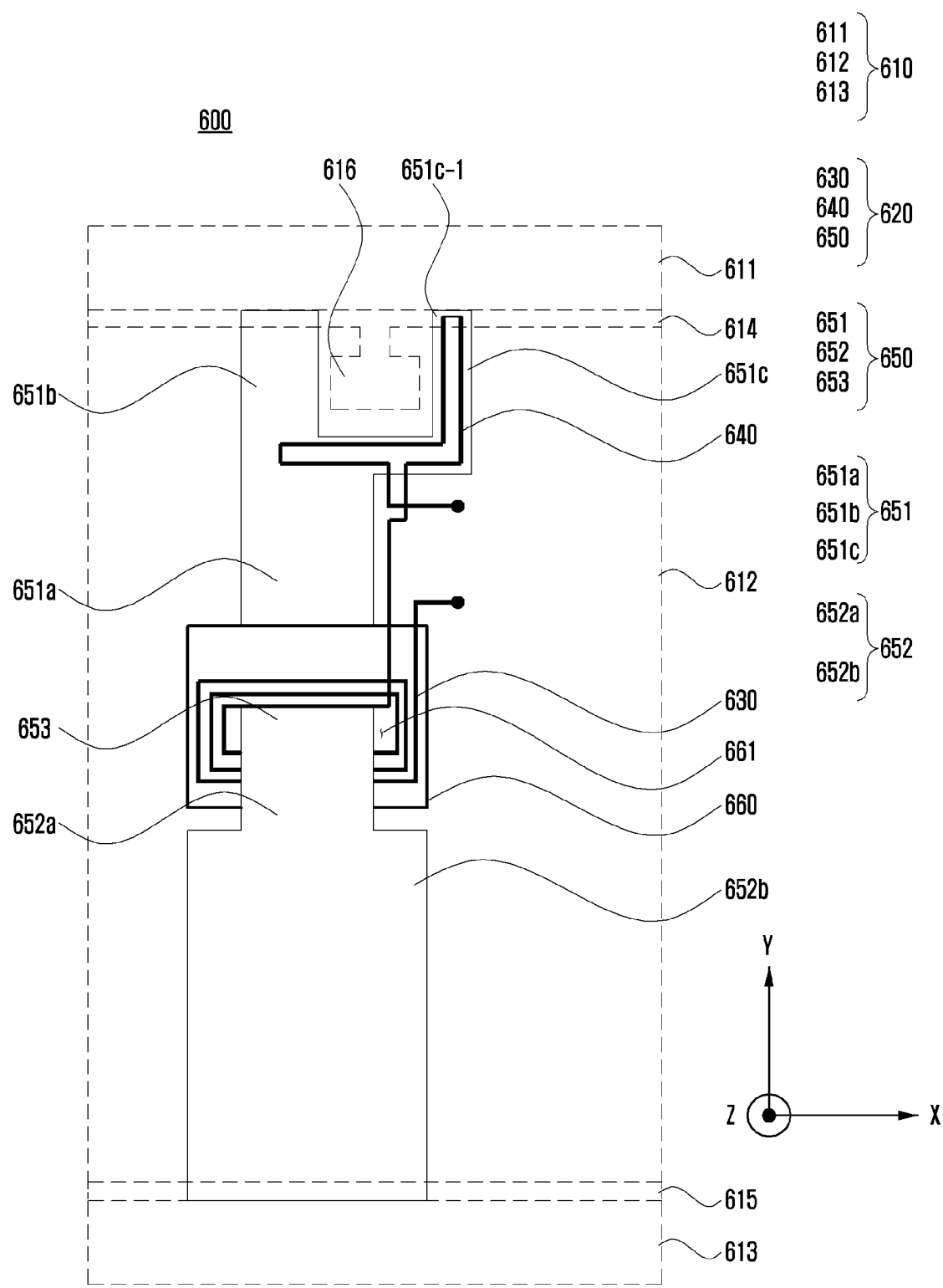
FIG. 6 illustrates a view of the rear face of an electronic device according to various embodiments and an antenna positioned thereunder.

FIG. 6 illustrates a view of the rear face of an electronic device 600 according to various embodiments and an antenna positioned thereunder. For convenience, a description of components overlapping those in FIG. 5 will be omitted or the components will be described briefly. Referring to FIG. 6, the rear face 610 of the electronic device 600 (e.g., the rear face 510 in FIG. 5) may include an upper area 611, a central area 612, and a lower area 613, which are formed of a conductive material. An upper slit 614 and a lower slit 615 for separating the areas 611, 612, and 613 may be filled with a non-conductive material. In the central area 612, an opening 616 may be formed in a portion adjacent to the upper slit 614. An antenna 620 (e.g., the antenna 420 in FIG. 4A) may be disposed below the rear face 610 when viewed from above the rear face 610. The antenna 620 may include a first conductive film 630 configured to generate a second magnetic flux in a first direction or in a second direction opposite the first direction, a second conductive coil 640 configured to generate a magnetic flux in a direction opposite the direction of the magnetic flux generated by the first conductive coil 630 simultaneously with the generation of the magnetic flux by the first conductive coil 630, and a magnetic guide body 650 configured to guide the magnetic fluxes in a third direction substantially perpendicular to the first direction or the second direction or in a fourth direction opposite the third direction. The first conductive coil 630 may be disposed on the FPCB 660, and the second conductive coil 640 may be disposed on the magnetic guide body 650 in the state of being insulated from the magnetic guide body 650. When viewed from above the rear face 610, the magnetic guide body 650 may include a first extension 651 located below the FPCB 660 and extending to the upper slit 614, a second extension 652 located above the FPCB 660 and extending to the lower slit 615, and a connection portion 653 located in the opening 661 in the FPCB 660 and interconnecting the first extension 651 and the second extension 652.

According to various embodiments, the first extension 651 may include a $(1-1)_{th}$ extension 651a extending from the connection portion 653, and a $(1-2)_{th}$ extension 651b extending from the $(1-1)_{th}$ extension 651a to the upper slit 614 while bypassing the left side of the opening 616 when viewed from above the rear face 610, and a $(1-3)_{th}$ extension 651c extending from the $(1-1)_{th}$ extension 651a to the upper slit 614 while bypassing the right side of the opening 616 when viewed from above the rear face 610. The second extension 652 may include a $(2-1)_{th}$ extension 652a extending from the connection portion 653, and a $(2-2)_{th}$ extension 652b, which is thicker than the $(2-1)_{th}$ extension 652a when viewed from above the rear face 610 and extends from the $(2-1)_{th}$ extension 652a to the lower slit 615.

According to various embodiments, the second conductive coil 640 may be a coil that is wound once or more along a path passing through an end portion 651c_1 of the $(1-3)_{th}$ extension 651c and is then connected to the first conductive coil 630.

Figure 7:
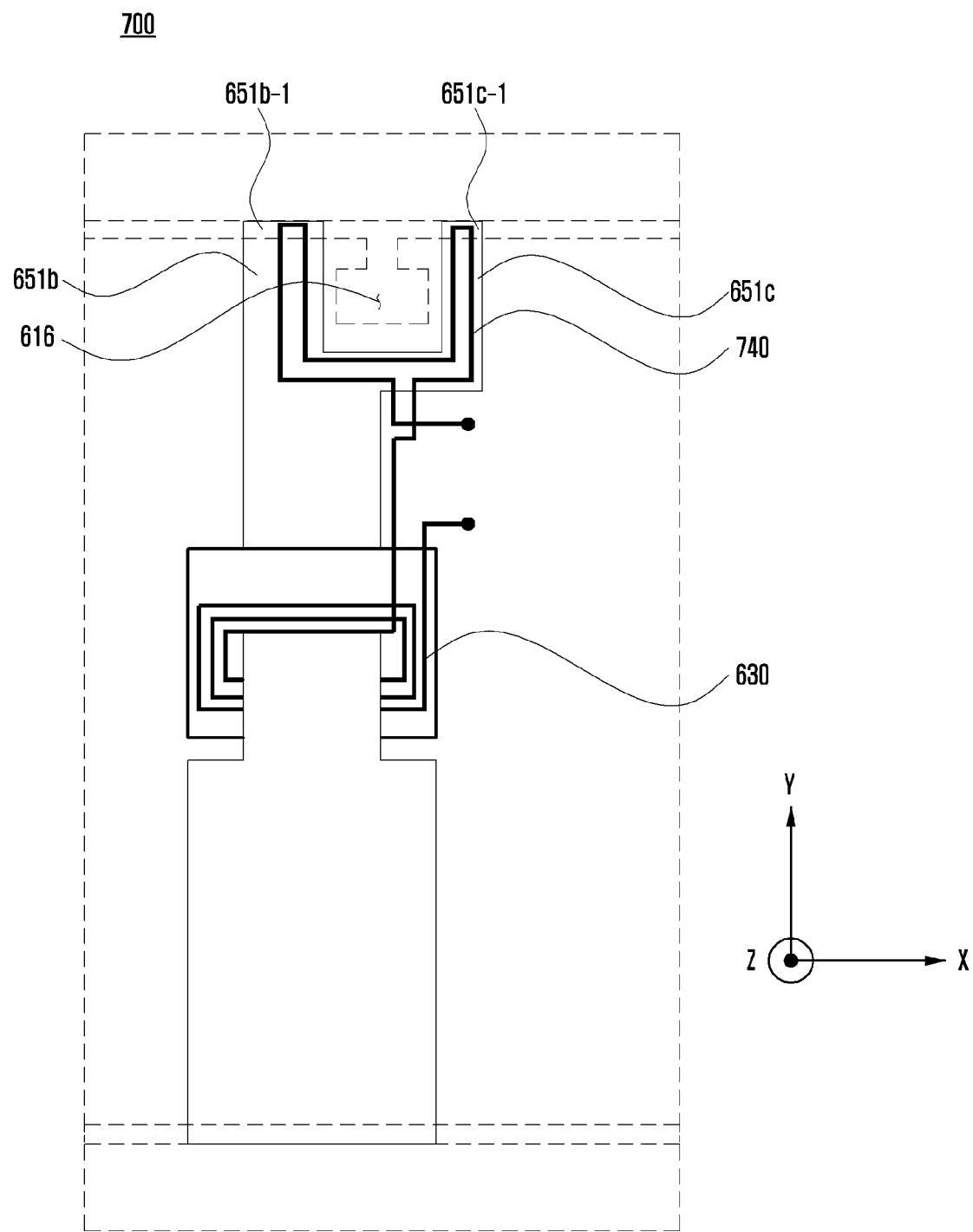
FIG. 7 illustrates a view of the rear face of an electronic device according to various embodiments and an antenna positioned thereunder.

FIG. 7 illustrates a view of the rear face of an electronic device 700 according to various embodiments and an antenna positioned thereunder. For convenience, a description of components overlapping those in FIG. 6 will be omitted, and components different from those in FIG. 6 will be described. Referring to FIG. 7, a second conductive coil 740 according to various embodiments may be a coil that passes through an end portion 651b_1 of the $(1-2)_{th}$ extension 651b, then bypasses the opening 616, is wound once or more along a path passing through an end portion 651c_1 of the $(1-3)_{th}$ extension 651c, and is then connected to the first conductive coil 630.

Figure 8:
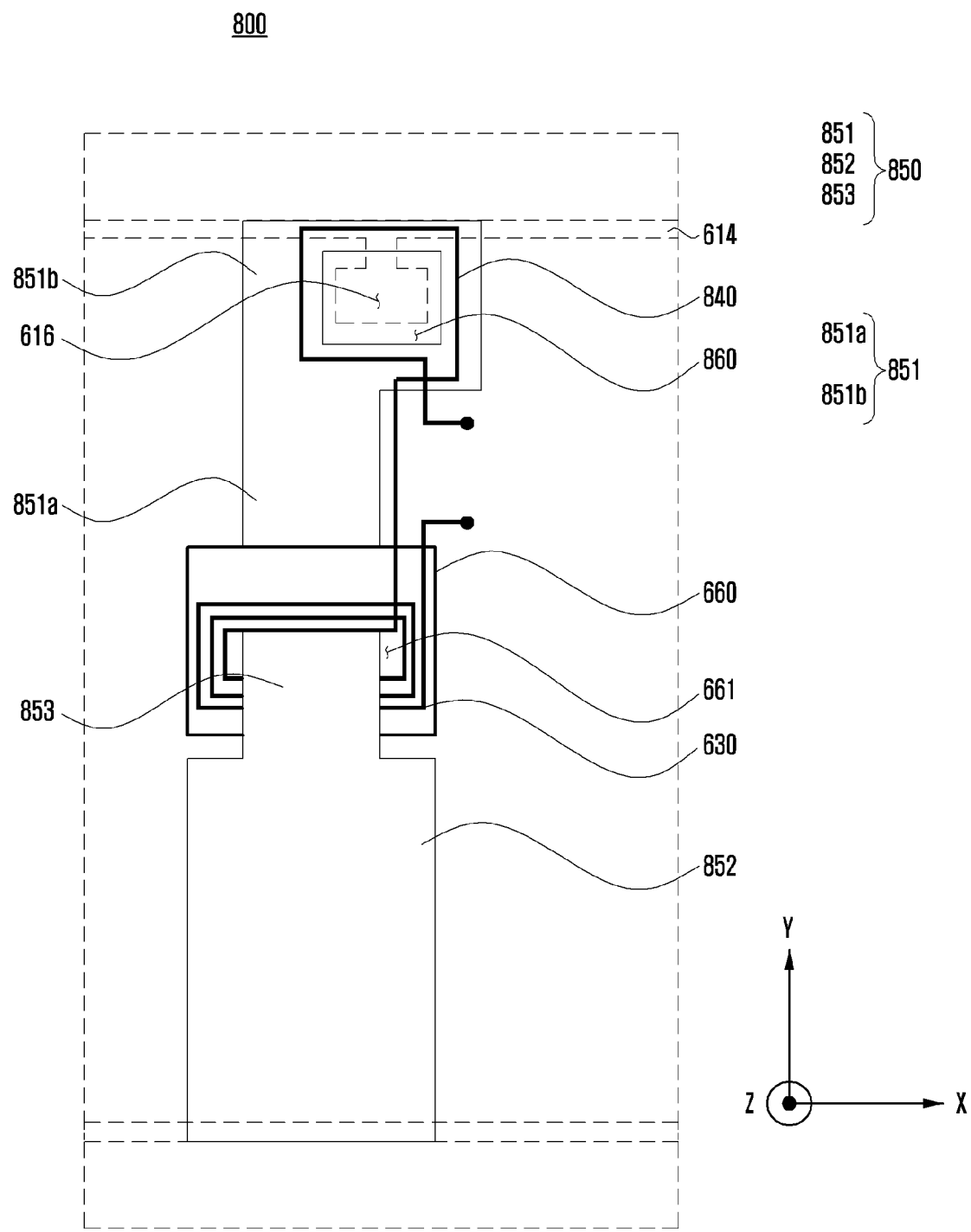
FIG. 8 illustrates a view of the rear face of an electronic device according to various embodiments and an antenna positioned thereunder.

FIG. 8 illustrates a view of the rear face of an electronic device 800 according to various embodiments and an antenna positioned thereunder. For convenience, a description of components overlapping those in FIG. 6 will be omitted, and components different from those in FIG. 6 will be described. Referring to FIG. 8, when viewed from above the rear face 610, the magnetic guide body 850 may include a first extension 851 located below the FPCB 660 and extending to the upper slit 614, a second extension 852 located above the FPCB 660 and extending to the lower slit 615, and a connection portion 853 located in the opening 661 and interconnecting the first extension 851 and the second extension 852.

According to various embodiments, the first extension 851 may include a $(1\text{-}1)_{th}$ extension 851a extending from the connection portion 853, and a $(1\text{-}2)_{th}$ extension 851b extending from the $(1\text{-}1)_{th}$ extension 851a to the upper slit 614. The opening 860 may be formed in the $(1\text{-}2)_{th}$ extension 851b to be larger than the opening 616 while being aligned with the opening 616 when viewed from above the rear face 610.

According to various embodiments, the second conductive coil 840 may be a coil that is turned once or more around the opening 860 as an axis and is then connected to the first conductive coil 630.

Figure 9:
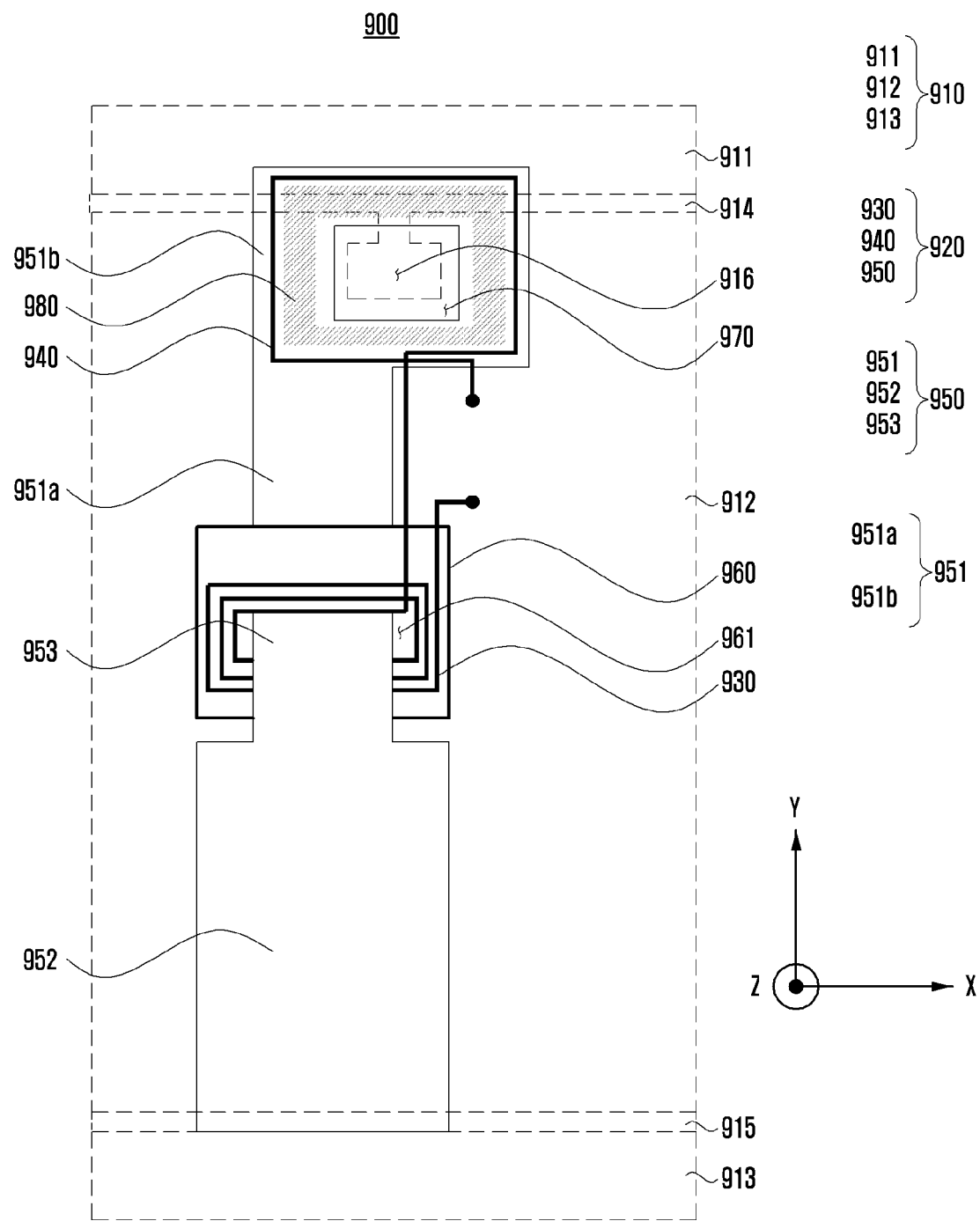
FIG. 9 illustrates a view of the rear face of an electronic device according to various embodiments and an antenna positioned thereunder.

FIG. 9 illustrates a view of the rear face of an electronic device 900 according to various embodiments and an antenna positioned thereunder. For convenience, a description of components overlapping those in FIG. 5 will be omitted or the components will be described briefly. Referring to FIG. 9, the rear face 910 of the electronic device 900 (e.g., the rear face 510 in FIG. 5) may include an upper area 911, a central area 912, and a lower area 913, which are formed of a conductive material. An upper slit 914 and a lower slit 915 for separating the areas 911, 912, and 913 may be filled with a non-conductive material. In the central area 912, a first opening 916 may be formed in a portion adjacent to the upper slit 914. An antenna 920 (e.g., the antenna 420 in FIG. 4A) may be disposed below the rear face 910 when viewed from above the rear face 910. The antenna 920 may include a first conductive film 930 configured to generate a second magnetic flux in a first direction or in a second direction, a second conductive coil 940 configured to generate a magnetic flux in a direction opposite the direction of the magnetic flux generated by the first conductive coil 930 simultaneously with the generation of the magnetic flux by the first conductive coil 930, and a magnetic guide body 950 configured to guide the magnetic fluxes in a third direction substantially perpendicular to the first direction or the second direction or in a fourth direction opposite the third direction. The first conductive coil 930 may be disposed on the FPCB 960, and the second conductive coil 940 may be disposed on the magnetic guide body 950 in the state of being insulated from the magnetic guide body 950.

According to various embodiments, when viewed from above the rear face 910, the magnetic guide body 950 may include a first extension 951 located below the FPCB 960 and extending beyond the upper slit 914 to the upper area 911, a second extension 952 located above the FPCB 960 and extending to the lower slit 915, and a connection portion 953 located in the opening 961 in the FPCB 960 and interconnecting the first extension 951 and the second extension 952. According to an embodiment, the first extension 951 may include a $(1\text{-}1)_{th}$ extension 951a extending from the connection portion 953, and a $(1\text{-}2)_{th}$ extension 951b extending from the $(1\text{-}1)_{th}$ extension 915a to the upper slit 911 beyond the upper slit 914. An opening 970 may be formed in the $(1\text{-}2)_{th}$ extension 951b to be larger than the first opening 916 while being aligned with the first opening 916 when viewed from above the rear face 910.

According to various embodiments, a third conductive coil 980 (e.g., the NFC antenna 297-3 in FIG. 2) may be disposed in the (1-2) extension 951b in a form surrounding the second opening 970 in the state of being insulated from the $(1\text{-}2)_{th}$ extension 951b. The second conductive coil 940 may be a coil that is turned once or more around the third conductive coil 980 as an axis and is then connected to the first conductive coil 930.

Figure 10:
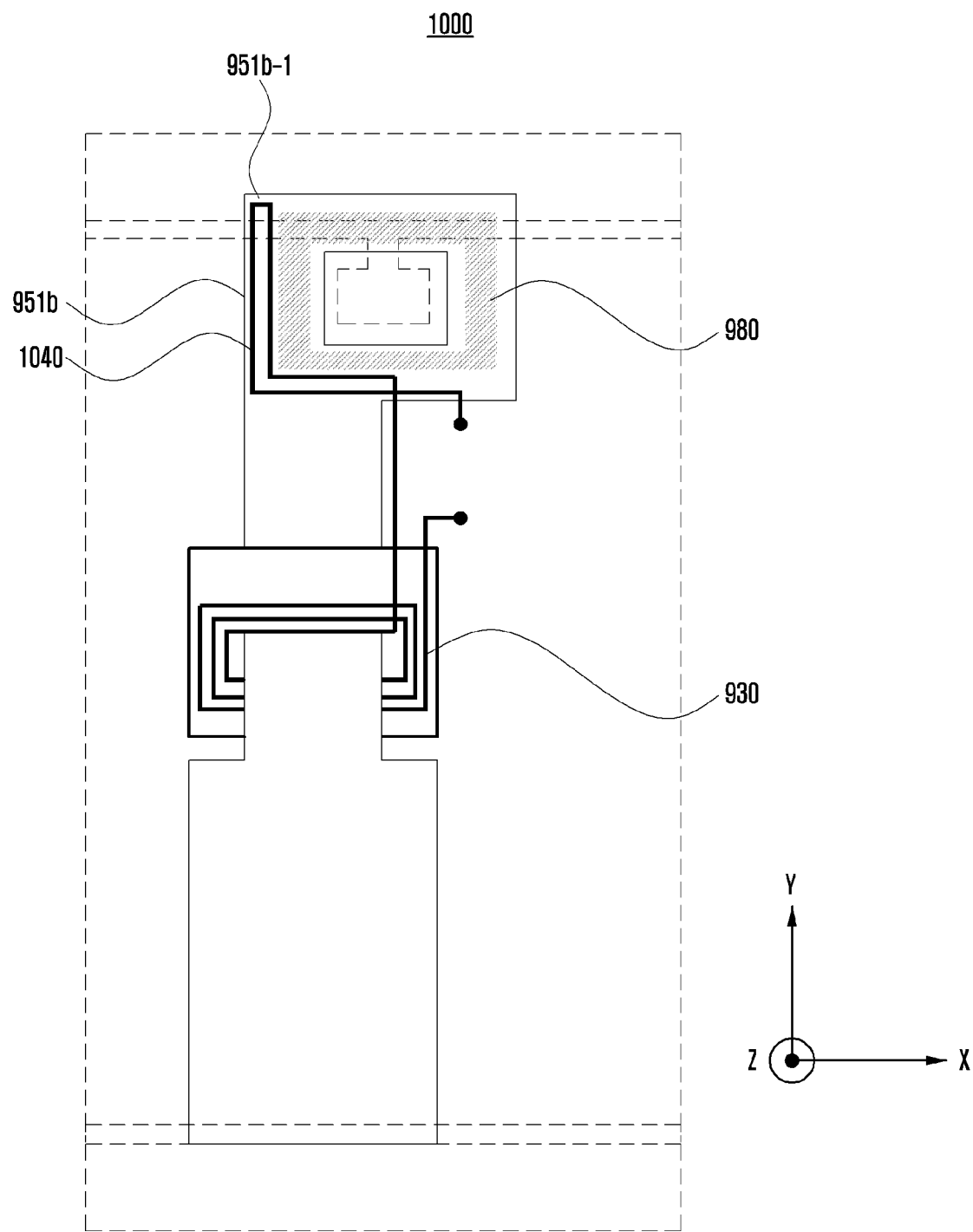
FIG. 10 illustrates a view of the rear face of an electronic device according to various embodiments and an antenna positioned thereunder.

FIG. 10 illustrates a view of the rear face of an electronic device 1000 according to various embodiments and an antenna positioned thereunder. For convenience, a description of components overlapping those in FIG. 9 will be omitted, and only components different from those in FIG. 9 will be described. Referring to FIG. 10, a second conductive coil 1040 according to various embodiments may be a coil that is wound once or more along a path that passes through one side (e.g., the right side) of the third conductive coil 980 so as not to overlap the third conductive coil 980 and returns from an end portion 951b_1 of the $(1\text{-}2)_{th}$ extension 951b along the one side of the third conductive coil 980 so as not to overlap the third conductive coil 980, and is then connected to the first conductive coil 930.

Figure 11A:
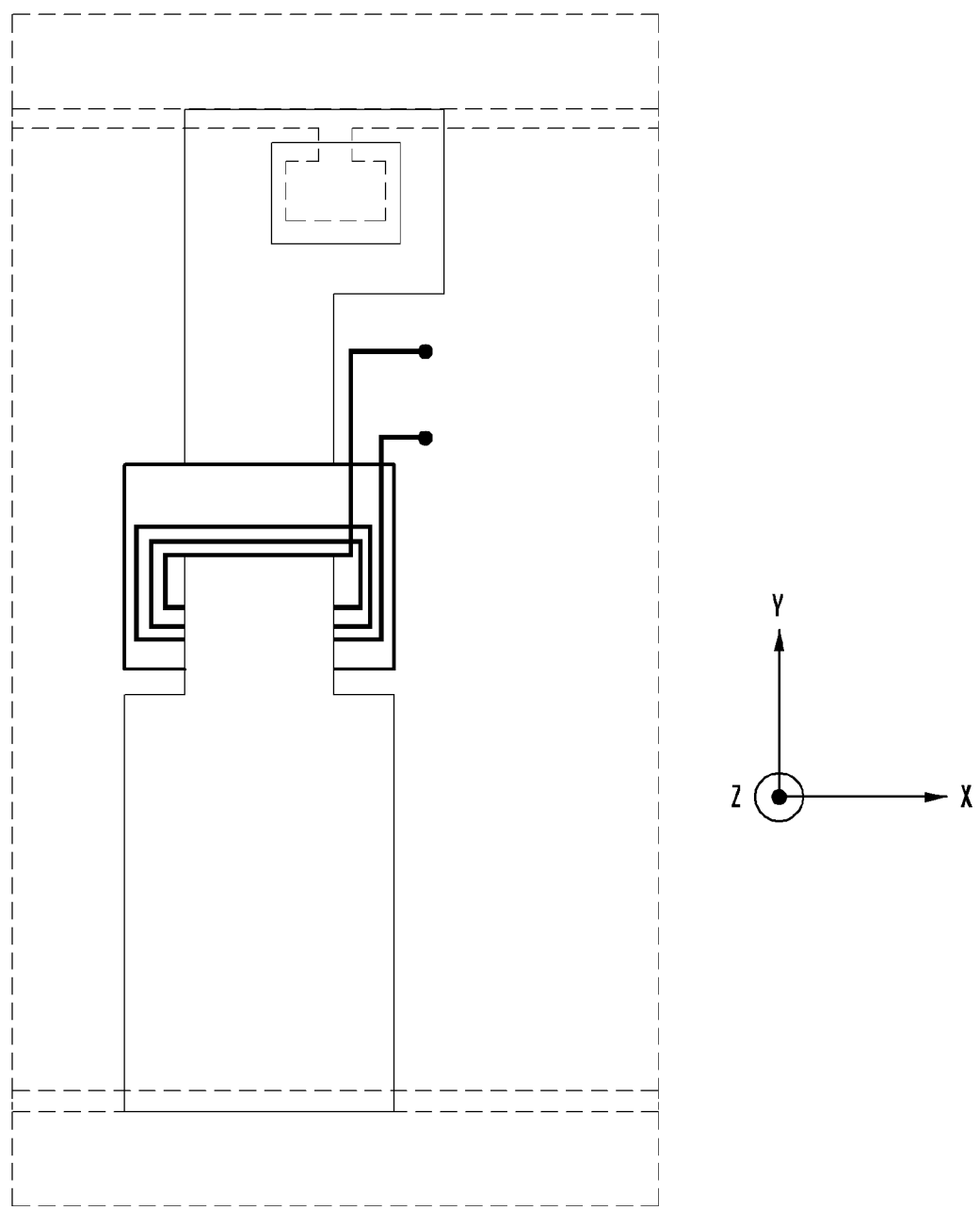
FIG. 11A illustrates a view of a first electronic device having an antenna configured to generate a magnetic flux with one conductive coil.
Figure 11B:
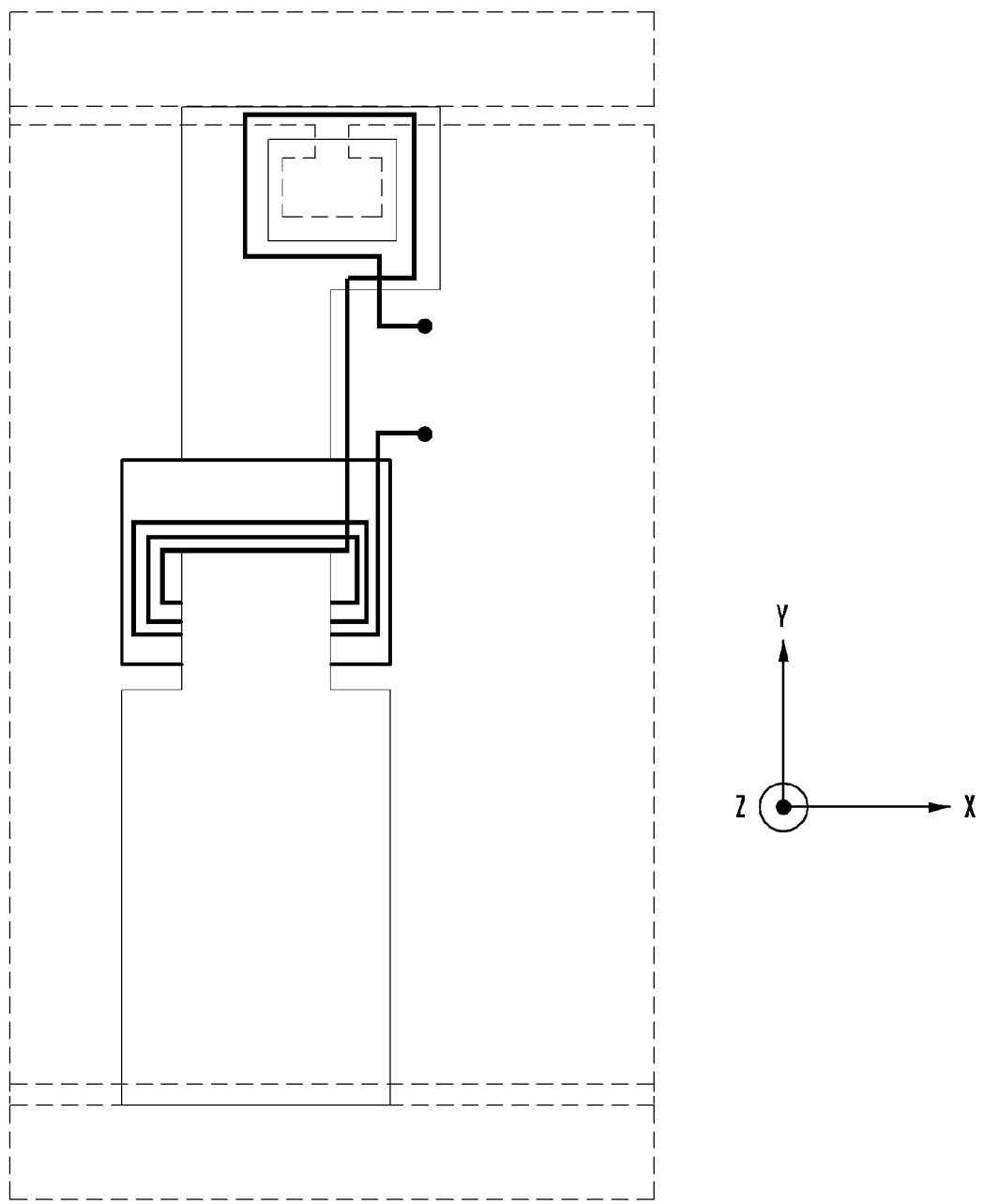
FIG. 11B illustrates a view of a second electronic device having an antenna configured to generate a magnetic flux using aiding connection between conductive coils.

FIG. 11A illustrates a view of a first electronic device 1110 having an antenna configured to generate a magnetic flux with one conductive coil. For example, the first electronic device 1110 may correspond to the electronic device 800 of FIG. 8, except that the second conductive coil 840 is removed from the electronic device 800. FIG. 11B illustrates a view of a second electronic device 1120 having an antenna configured to generate a magnetic flux using aiding connection between conductive coils. For example, the second electronic device 1120 may correspond to the electronic device 800 of FIG. 8.

Figure 11C:
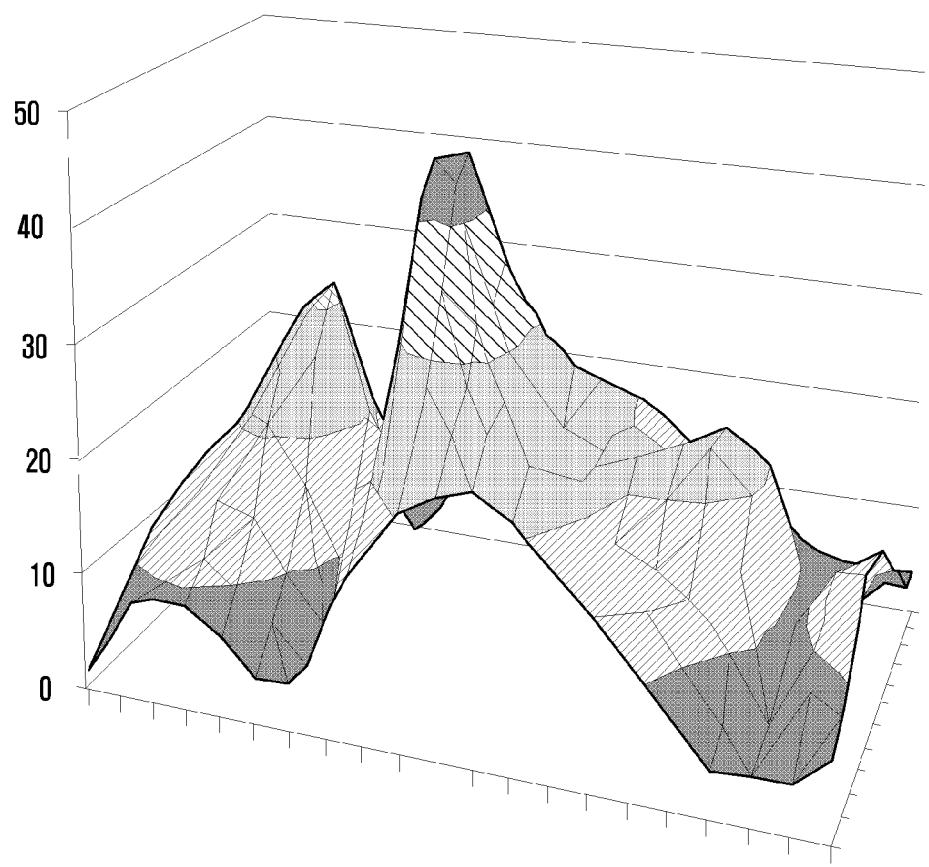
FIGS. 11C, 11D, 11E, and 11F illustrate views showing the results of testing the radiation performance of the first electronic device and the second electronic device.
Figure 11C:
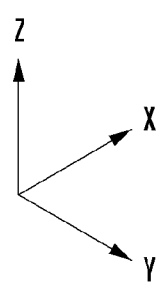
Figure 11D:
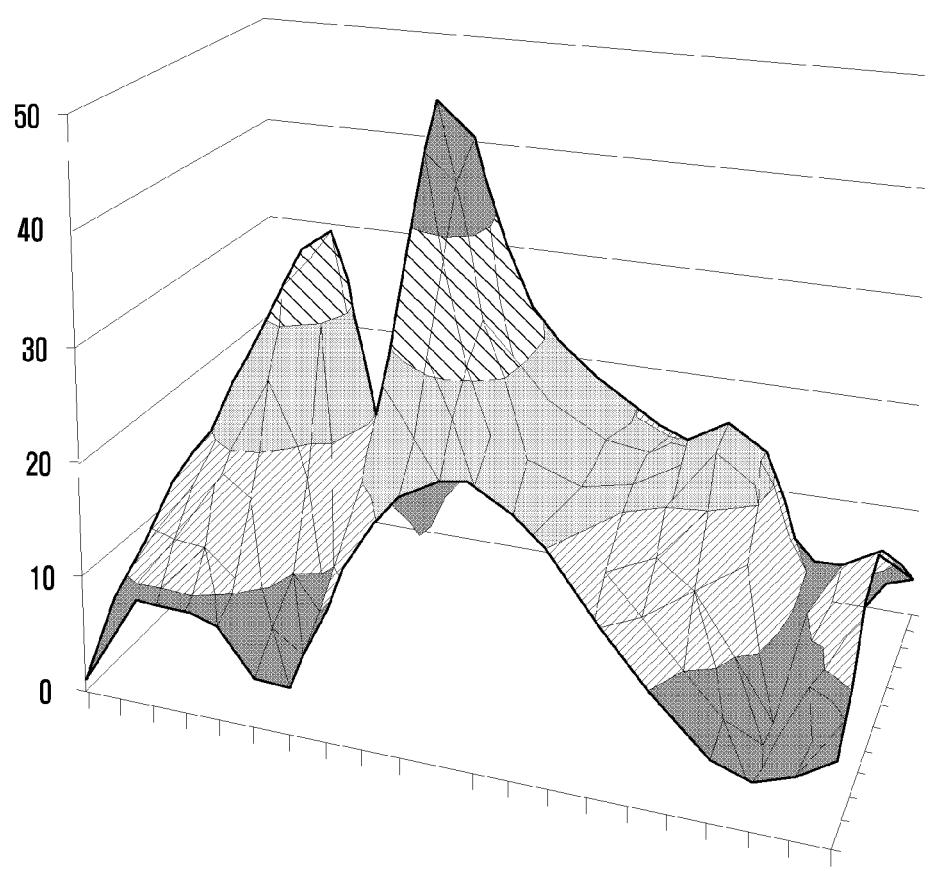

FIG. 11C illustrates a diagram showing the results of testing the radiation performance of the first electronic device 1110. FIG. 11D illustrates a diagram showing the results of testing the radiation performance of the second electronic device 1120. For example, the XY plane of FIGS. 11C and 11D may represent the rear face of the first electronic device 1110 and the rear face of the second electronic device 1120. The Z-axis in FIGS. 11C and 11D represents a voltage value (mV) showing radiation efficiency at XY coordinates.

Figure 11E:
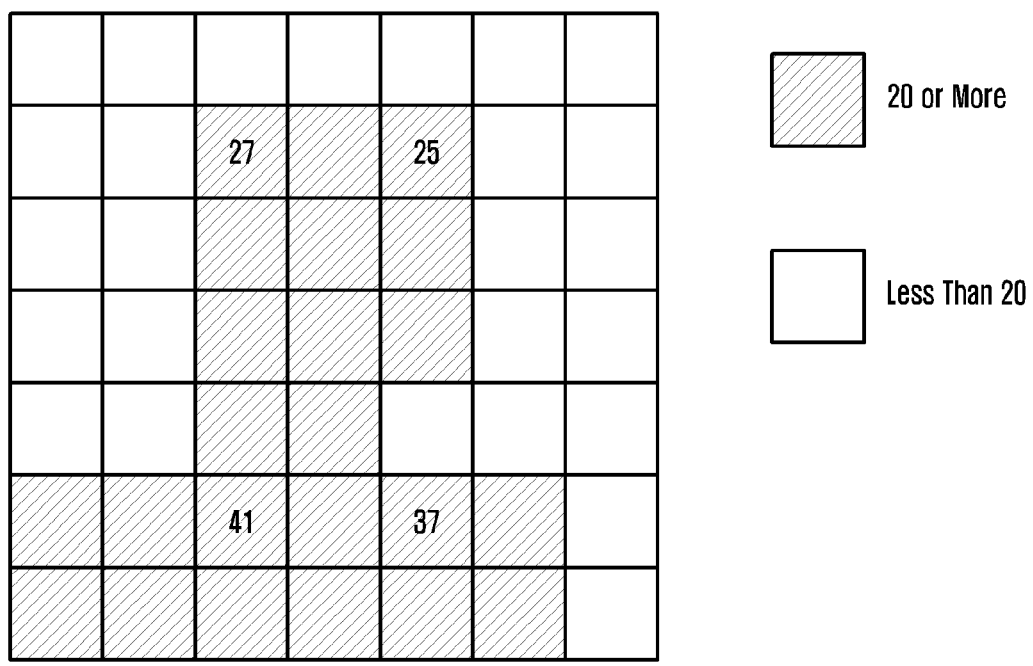
Figure 11F:
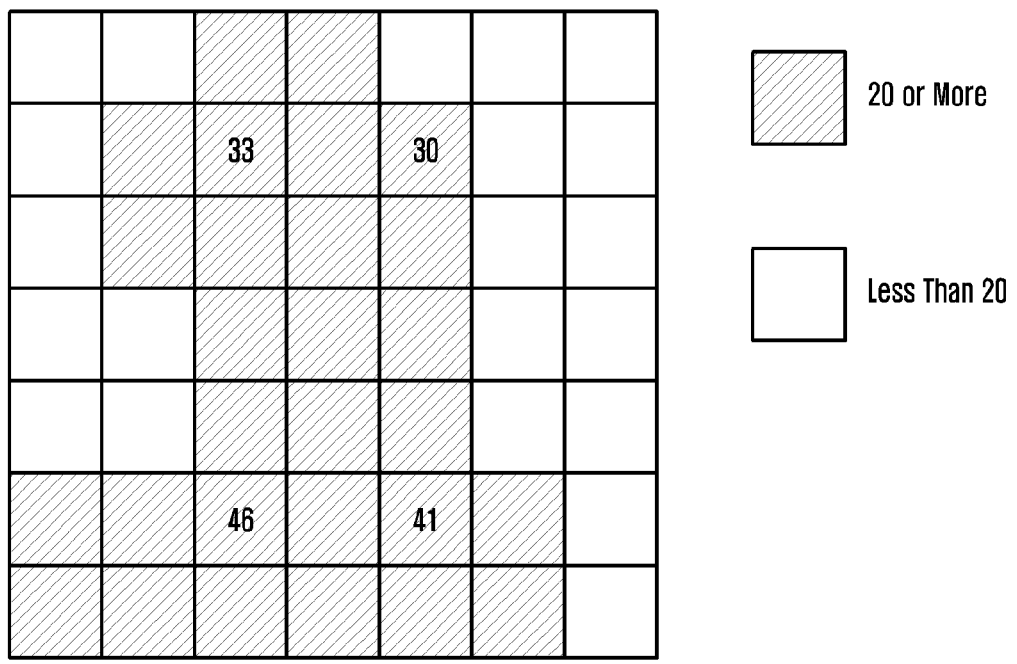

FIG. 11E illustrates a diagram showing an area having a voltage value of 20 mV or more in the XY plane of FIG. 11C, and FIG. 11F illustrates a diagram showing an area having a voltage value of 20 mV or more in the XY plane of FIG. 11D.

Referring to FIGS. 11C and 11D, it can be seen that, compared with the first electronic device 1110, the second electronic device 1120 is improved in radiation efficiency through the aiding connection without increasing the internal resistance (e.g., the internal resistance of the first conductive coil 830 in FIG. 8).

Referring to FIGS. 11E and 11F, when it is assumed that an external electronic device (e.g., a POS device) recognizes a magnetic signal (e.g., an MST signal) at a voltage value of, for example, 20 mV or more, it can be seen that the second electronic device 1120 has a larger recognition area than the first electronic device 1110 through the aiding connection. It can also be seen that the total sum of voltage values in the second electronic device 1120 is larger than that in the first electronic device 1110.

According to various embodiments, an electronic device (e.g., the electronic device 400 in FIG. 4) may include: a housing including a first face oriented in a first direction, a second face oriented in a second direction that is opposite the first direction, and a side face that surrounds a space between the first face and the second face; a conductive material (e.g., the first conductive coil 440 in FIG. 4) that forms at least a portion of the second face; a first conductive coil located in the housing and below the second face when viewed from above the second face, the first conductive coil being configured to generate a magnetic flux in the first direction or the second direction; a second conductive coil (e.g., the second conductive coil 450 in FIG. 4) located in the housing and next to the first conductive coil when viewed from above the second face, and connected to the first conductive coil in series so as to form a single current path, the second conductive coil being configured to generate a magnetic flux in a direction opposite the direction of the magnetic flux generated by the first conductive coil; a wireless communication circuit (e.g., the wireless communication module 410 in FIG. 4) located in the housing and configured to feed current to the first conductive coil and the second conductive coil; and a magnetic guide body (e.g., the magnetic guide body 460 in FIG. 4) configured to guide a magnetic flux radiated in the first direction or the second direction to a third direction substantially perpendicular to the first direction or the second direction or to a fourth direction opposite the third direction.

According to various embodiments, the magnetic guide body may include a first extension (e.g., the first extension 461 in FIG. 4) located below the first conductive coil and extending in the third direction and a second extension (e.g., the second extension 462 in FIG. 4) located above the first conductive coil and extending in the fourth direction, when viewed from above the second face.

According to various embodiments, the second conductive coil is located above the first extension in the state of being insulated from the first extension.

According to various embodiments, the second face may include a first conductive material (e.g., the central area 512 in FIG. 5), a first non-conductive material (e.g., the non-conductive material in the upper slit 514 in FIG. 5), and a second non-conductive material (e.g., the non-conductive material in the lower slit 515 in FIG. 5). The first conductive coil may be located below the first conductive material when viewed from above the second face. At least a portion of the second conductive coil may be located below the first conductive material when viewed from above the second face. The first non-conductive material and the second non-conductive material may be located at opposite sides of the first conductive material when viewed from above the second face, the first non-conductive material being located at a side in the third direction and the second non-conductive material being located at a side in the fourth direction.

According to various embodiments, the first extension may extend to the first non-conductive material when viewed from above the second face.

According to various embodiments, a first opening (e.g., the opening 516 in FIG. 5 or the opening 616 in FIG. 6) is formed in the first conductive material, and may extend to the first non-conductive material without overlapping the first opening when viewed from above the second face.

According to various embodiments, the first extension may include a portion that bypasses the left side of the first opening and extends to the first non-conductive material (e.g., the (1-2)$_{th}$ extension 651b in FIG. 6) and a portion that bypasses the right side of the first opening and extends to the first non-conductive material (e.g., the (1-3)$_{th}$ extension 651c), when viewed from above the second face.

According to various embodiments, the first extension may have a second opening (e.g., the opening 860 in FIG. 8) formed therein to be larger than the first opening while being aligned with the first opening when viewed from above the second face, and the second conductive coil may be turned once or more about the second opening as an axis and may then be connected to the second conductive coil.

According to various embodiments, the first extension may have a second opening formed therein to be larger than the first opening while being aligned with the first opening when viewed from above the second face, and a third conductive coil (e.g., the third conductive coil 980 in FIG. 9) disposed on the first extension in a form surrounding the second opening, and the second conductive coil may be turned once or more about the third conductive coil as an axis and may then be connected to the second conductive coil.

According to various embodiments, the first conductive coil and the second conductive coil may support magnetic secure transmission (MST) communication, and the third conductive coil may support near-field communication (NFC).

According to various embodiments, the second extension may extend to the second non-conductive material when viewed from above the second face.

According to various embodiments, the wireless communication circuit may include an MST communication circuit.

According to various embodiments, the first conductive coil may be disposed on an FPCB (e.g., the first FPCB 480 in FIG. 4) having one or more layers.

According to various embodiments, an opening (e.g., the opening 481 in FIG. 4) may be formed in the FPCB, and the magnetic guide body may include a first extension located below the FPCB and extending in the third direction, a second extension located above the FPCB and extending in the fourth direction, and a connection portion (e.g., the connection portion 463 in FIG. 4) located in the opening and interconnecting the first extension and the second extension.

According to various embodiments, the first conductive coil may be wound about the opening.

According to various embodiments, an electronic device (e.g., the electronic device 400 in FIG. 4) may include: a housing including a first face oriented in a first direction, a second face oriented in a second direction that is opposite the first direction, and a side face that surrounds a space between the first face and the second face; a first conductive coil (e.g., the first conductive coil 440 in FIG. 4) located in the housing and below the second face when viewed from above the second face, the first conductive coil being configured to generate a magnetic flux in the first direction or the second direction; a second conductive coil (e.g., the second conductive coil 450 in FIG. 4) located in the housing and next to the first conductive coil when viewed from above the second face, and connected to the first conductive coil in series to form a single current path, the second conductive coil being configured to generate a magnetic flux in a direction opposite the direction of the magnetic flux generated by the first conductive coil; a wireless communication circuit (e.g., the wireless communication module 410 in FIG. 4) located in the housing and configured to feed current to the first conductive coil and the second conductive coil; an FPCB (e.g., the first FPCB 480 in FIG. 4) including an opening (e.g., the opening 481 in FIG. 4), the first conductive coil being wound about the opening; and a magnetic guide body (e.g., the magnetic guide body 460 in FIG. 4) including a first extension extending in a third direction substantially perpendicular to the first direction or the second direction, a second extension extending in a fourth direction that is opposite the third direction, and a connection portion located in the opening and interconnecting the first extension and the second extension.

According to various embodiments, the first extension may be located below the FPCB and the second extension may be located above the FPCB when viewed from above the second face.

According to various embodiments, the wireless communication circuit may include an MST communication circuit.

According to various embodiments, the second conductive coil may be located above the first extension when viewed from above the second face.

According to various embodiments, the first conductive coil may be wound about the opening.

The embodiments of the disclosure disclosed in the specification and the drawings are only particular examples proposed in order to easily describe the technical matters of the disclosure and help with comprehension of the disclosure, and do not limit the scope of the disclosure. Therefore, in addition to the embodiments disclosed herein, the scope of the various embodiments of the disclosure should be construed to include all modifications or modified forms drawn based on the technical idea of the various embodiments of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing including a first face oriented in a first direction, a second face oriented in a second direction that is opposite the first direction, and a side face between the first face and the second face;
   a conductive material that forms at least a portion of the second face;
   a first conductive coil located in the housing and below the second face when viewed from above the second face, the first conductive coil configured to generate a magnetic flux in the first direction or the second direction;
   a second conductive coil located in the housing and next to the first conductive coil when viewed from above the second face, the second conductive coil connected to the first conductive coil in series to form a single current path, the second conductive coil configured to generate a magnetic flux in a direction opposite a direction of the magnetic flux generated by the first conductive coil;
   a wireless communication circuit located in the housing and configured to feed current to the first conductive coil and the second conductive coil; and
   a magnetic guide body configured to guide a magnetic flux radiated in the first direction or the second direction to (i) a third direction substantially perpendicular to the first direction or the second direction or (ii) a fourth direction opposite the third direction.

2. The electronic device of claim 1, wherein the magnetic guide body includes a first extension located below the first conductive coil and extending in the third direction and a second extension located above the first conductive coil and extending in the fourth direction, when viewed from above the second face.

3. The electronic device of claim 2, wherein the second conductive coil is located above the first extension in a state of being insulated from the first extension.

4. The electronic device of claim 2, wherein the second face includes a first conductive material, a first non-conductive material, and a second non-conductive material,
   the first conductive coil is located below the first conductive material when viewed from above the second face,
   at least a portion of the second conductive coil is located below the first conductive material when viewed from above the second face, and
   the first non-conductive material and the second non-conductive material are located at opposite sides of the first conductive material when viewed from above the second face, the first non-conductive material being located at a side in the third direction and the second non-conductive material being located at a side in the fourth direction.

5. The electronic device of claim 4, wherein the first extension extends to the first non-conductive material when viewed from above the second face.

6. The electronic device of claim 5, wherein the first conductive material has a first opening formed therein, and the first extension extends to the first non-conductive material without overlapping the first opening when viewed from above the second face.

7. The electronic device of claim 6, wherein the first extension includes a portion that bypasses a left side of the first opening and extends to the first non-conductive material and a portion that bypasses a right side of the first opening and extends to the first non-conductive material, when viewed from above the second face.

8. The electronic device of claim 6, wherein the first extension has a second opening formed therein to be larger than the first opening while being aligned with the first opening when viewed from above the second face, and
   the second conductive coil is turned once or more about the second opening as an axis and is then connected to the second conductive coil.

9. The electronic device of claim 6, wherein the first extension has a second opening formed therein to be larger than the first opening while being aligned with the first opening when viewed from above the second face, and a third conductive coil disposed thereon in a form surrounding the second opening, and
   the second conductive coil is turned once or more about the third conductive coil as an axis and is then connected to the second conductive coil.

10. The electronic device of claim 9, wherein the first conductive coil and the second conductive coil support magnetic secure transmission (MST) communication, and
    the third conductive coil supports near-field communication (NFC).

11. The electronic device of claim 4, wherein the second extension extends to the second non-conductive material when viewed from above the second face.

12. The electronic device of claim 1, wherein the wireless communication circuit includes an MST communication circuit.

13. The electronic device of claim 1, wherein the first conductive coil is formed on an FPCB having one or more layers.

14. The electronic device of claim 13, wherein the FPCB has an opening formed therein, and
    the magnetic guide body includes a first extension located below the FPCB and extending in the third direction, a second extension located above the FPCB and extending in the fourth direction, and a connection portion located in the opening and interconnecting the first extension and the second extension.

15. The electronic device of claim 14, wherein the first conductive coil is wound about the opening.

16. An electronic device comprising:
    a housing including a first face oriented in a first direction, a second face oriented in a second direction that is opposite the first direction, and a side face between the first face and the second face;

a first conductive coil located in the housing and below the second face when viewed from above the second face, the first conductive coil configured to generate a magnetic flux in the first direction or the second direction;

a second conductive coil located in the housing and next to the first conductive coil when viewed from above the second face, the second conductive coil connected to the first conductive coil in series to form a single current path, the second conductive coil configured to generate a magnetic flux in a direction opposite a direction of the magnetic flux generated by the first conductive coil;

a wireless communication circuit located in the housing and configured to feed current to the first conductive coil and the second conductive coil;

an FPCB including an opening, the first conductive coil being wound about the opening; and a magnetic guide body including a first extension extending in a third direction substantially perpendicular to the first direction or the second direction, a second extension extending in a fourth direction that is opposite the third direction, and a connection portion located in the opening and interconnecting the first extension and the second extension.

17. The electronic device of claim 16, wherein the first extension is located below the FPCB and the second extension is located above the FPCB when viewed from above the second face.

18. The electronic device of claim 16, wherein the wireless communication circuit includes an MST communication circuit.

19. The electronic device of claim 16, wherein the second conductive coil is located above the first extension when viewed from above the second face.

20. The electronic device of claim 16, wherein the first conductive coil is wound about the opening.

* * * * *